(12) United States Patent
Shimura et al.

(10) Patent No.: US 12,155,257 B2
(45) Date of Patent: Nov. 26, 2024

(54) BATTERY MODULE, BATTERY UNIT, AND CONVERTER DEVICE

(71) Applicant: MURATA MANUFACTURING CO., LTD., Kyoto (JP)

(72) Inventors: Jusuke Shimura, Kyoto (JP); Michiya Mori, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 333 days.

(21) Appl. No.: 17/752,254

(22) Filed: May 24, 2022

(65) Prior Publication Data

US 2022/0285965 A1 Sep. 8, 2022

Related U.S. Application Data

(63) Continuation of application No. PCT/JP2020/043313, filed on Nov. 20, 2020.

(30) Foreign Application Priority Data

Nov. 25, 2019 (JP) ................................ 2019-212120

(51) Int. Cl.
| | | |
|---|---|---|
| H02J 7/00 | (2006.01) |
| G01R 19/00 | (2006.01) |
| G01R 31/364 | (2019.01) |
| H01M 10/48 | (2006.01) |
| H01M 50/509 | (2021.01) |
| H02M 3/335 | (2006.01) |

(52) U.S. Cl.
CPC .... H02J 7/007182 (2020.01); G01R 19/0084 (2013.01); G01R 31/364 (2019.01); H01M 10/482 (2013.01); H01M 50/509 (2021.01); H02M 3/33584 (2013.01)

(58) Field of Classification Search
None
See application file for complete search history.

(56) References Cited

U.S. PATENT DOCUMENTS 9,325,178 B2 * 4/2016 Yun ...................... H02J 7/0019
10,063,082 B2 * 8/2018 Butzmann ........... H01M 10/482
2011/0121837 A1 * 5/2011 Kim ..................... G01R 31/396
324/434

(Continued)

FOREIGN PATENT DOCUMENTS

JP 2012210109 A 10/2012
JP 2015195636 A 11/2015

(Continued)

OTHER PUBLICATIONS

Japanese Office Action issued Aug. 15, 2023 in corresponding Japanese Application No. 2021-561368.

(Continued)

Primary Examiner — Arun C Williams
(74) Attorney, Agent, or Firm — K&L Gates LLP

(57) ABSTRACT

Provided is a battery module. The battery module includes a battery pack including cells connected in series with an amount of s and cells connected in parallel with an amount of p (s is an integer of 1 or more and p is an integer of 1 or more), and a bidirectional DC/DC converter. The converter is configured to generate a voltage nV (n is −1 or 2) with respect to a voltage V of the battery pack.

6 Claims, 8 Drawing Sheets

(56) References Cited

U.S. PATENT DOCUMENTS

| | | | |
|---|---|---|---|
| 2011/0199042 A1* | 8/2011 | Abe | H02J 3/32 320/136 |
| 2015/0002083 A1 | 1/2015 | Nakao | |
| 2017/0338668 A1* | 11/2017 | Sada | H02J 3/32 |

FOREIGN PATENT DOCUMENTS

| | | | |
|---|---|---|---|
| JP | 2015223058 A | 12/2015 | |
| JP | 2019134635 A | 8/2019 | |
| WO | 2013140710 A1 | 9/2013 | |

OTHER PUBLICATIONS

International Search Report of corresponding PCT application PCT/JP2020/043313, dated Jan. 19, 2021.
Japanese Office Action issued Apr. 4, 2023 in corresponding Japanese Application No. 2021-561368.

* cited by examiner

BATTERY MODULE, BATTERY UNIT, AND CONVERTER DEVICE

CROSS REFERENCE TO RELATED APPLICATIONS

The present application is a continuation of PCT patent application no. PCT/JP2020/043313, filed on Nov. 20, 2020, which claims priority to Japanese patent application no. JP2019-212120 filed on Nov. 25, 2019, the entire contents of which are being incorporated herein by reference.

BACKGROUND

The present technology relates to a battery module including a plurality of cells connected in series and/or in parallel, a battery unit wherein a plurality of battery modules are connected, and a converter device for balance.

In recent years, applications of secondary batteries such as lithium ion batteries have been rapidly expanded to automotive secondary batteries and power storage devices which are combined with new energy systems such as solar cells and wind power generation. Accordingly, a plurality of battery modules are connected in series and such design has been adopted to generate a large output using a large number of energy storage devices, for example, unit batteries (hereinafter, appropriately referred to as "cells"). In cylindrical batteries, one cylinder is seen as a cell, while one coated pack is seen as a cell in batteries coated with a laminate. Each of the battery modules includes a battery pack in which a plurality of, for example, four cells are connected in parallel as a battery block, a large number of battery blocks are connected in series to have a positive terminal and a negative terminal as a whole. Additionally, if the number of parallel connections is one and the number of series connections is also one, such configuration can be described as a battery module whose number of cells is one.

Further, a battery unit can be understood as a plurality of battery modules connected in series. In the battery unit, the capacity of the battery modules can be insufficiently exhibited or the life thereof shortened when the battery modules have different voltages.

To solve this problem, an active balancing circuit that controls the balance between cells has been proposed.

SUMMARY

The present technology relates to a battery module including a plurality of cells connected in series and/or in parallel, a battery unit wherein a plurality of battery modules are connected, and a converter device for balance.

A conventional technology is used to correct variations in charge/discharge states of cells in a battery module, but not to correct variations of battery modules. Further, when changing the cells into battery modules, since the active balancing circuit is connected between the battery modules, the active balancing circuit may not be compatible if the number of battery modules is changed, leading to a problem of insufficient flexibility.

Accordingly, an object of the present technology is to provide a battery module, a battery unit, and a converter device that have the flexibility of enabling a change in the number of battery modules to be connected.

According to an embodiment of the present disclosure, a battery module is provided. The battery module includes a battery pack including cells connected in series with an amount of s and cells connected in parallel with an amount of p (s is an integer of 1 or more and p is an integer of 1 or more), and a converter performing bidirectional DC/DC conversion.

The bidirectional DC/DC converter is configured to generate a voltage $nV$ (n is $-1$ or 2) with respect to a voltage V of the battery pack.

According to an embodiment of the present disclosure, a battery unit is provided. The battery unit includes a plurality of battery modules including a converter configured to generate a voltage $-V$ in the battery module are connected in series, and a voltage $-V$ generated by a battery module is supplied to a negative terminal of another battery module connected to a negative terminal side of the battery module.

According to an embodiment of the present disclosure, a battery unit is provided. The battery unit includes a plurality of battery modules including a converter configured to generate a voltage $2V$ in the battery module are connected in series, and a voltage $2V$ generated by a battery module is supplied to a positive terminal of another battery module connected to a positive terminal side of the battery module.

According to an embodiment of the present disclosure, a converter device is provided. The converter device includes a positive terminal and a negative terminal connected to a positive terminal and a negative terminal of the battery module and a converter that a current can flow in either direction. The converter is configured to generate a voltage $nV$ (n is $-1$ or 2) with respect to the voltage V of a battery pack of the battery module.

According to at least one embodiment, the present invention can flexibly allow a change in the number of battery modules connected in series. Further, the effects of the present technology are not necessarily limited by those described herein, and may be any of the effects described herein or be different from those described herein. Additionally, the contents of the present technology are not to be construed as being limited by the effects exemplified in the following description.

DETAILED DESCRIPTION

The embodiments described below are preferred specific examples of the present disclosure, and are technically limited from different aspects in a preferable way. The scope of the present disclosure is however not limited to these embodiments unless otherwise specified in the following description.

Figure 1A:
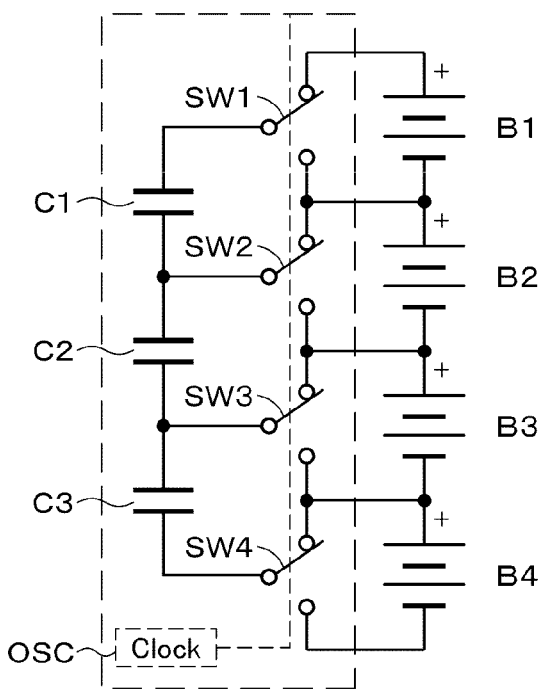
FIG. 1A is a connection diagram of an example of a conventional balancing circuit.
Figure 1B:
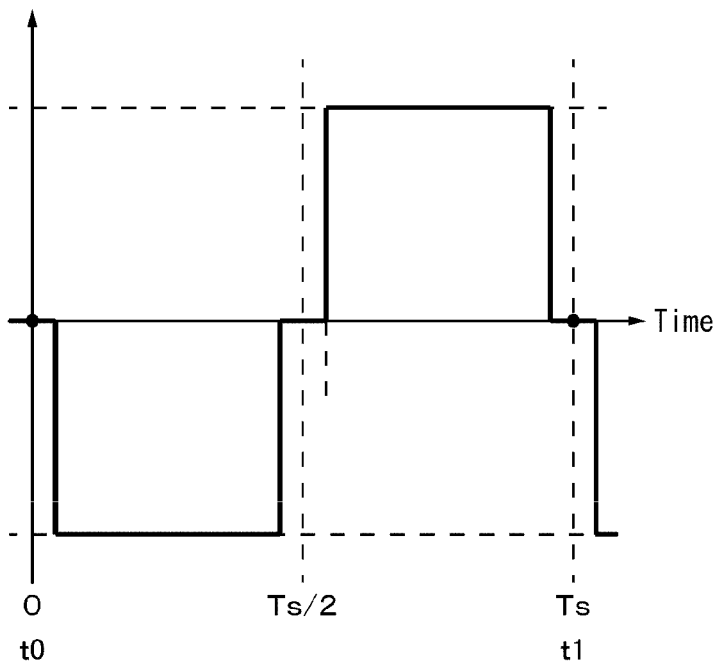
FIG. 1B is a waveform chart illustrating a drive waveform.

Prior to the description of the present disclosure, an example of conventional active balancing circuits is described referring to FIGS. 1A and 1B. FIG. 1A is a connection diagram illustrating a configuration of an active balancing circuit using a switched capacitor, and FIG. 1B is an example of a drive waveform.

For example, four cells B1, B2, B3, and B4 are connected in series to constitute a battery module. The positive side of the cell B1 is connected to the upper terminal of a switch SW1, and the negative side of the cell B1 is connected to the lower terminal of the switch SW1 and the upper terminal of a switch SW2. Similarly, the positive side and the negative side of the cell B2 are respectively connected to the upper terminal and the lower terminal of the switch SW2, the positive side and the negative side of the cell B3 are respectively connected to the upper terminal and the lower terminal of a switch SW3, and the positive side and the negative side of the cell B4 are respectively connected to the upper terminal and the lower terminal of a switch SW4.

A terminal (hereinafter, appropriately referred to as a "movable terminal") selectively connected to the upper terminal and the lower terminal of the switch SW1 is connected to one electrode of a capacitor C1. Capacitors C2 and C3 are connected in series with the capacitor C1. The movable terminal of the switch SW2 is connected to the connection midpoint of the capacitors C1 and C2, the movable terminal of the switch SW3 is connected to the connection midpoint of the capacitors C2 and C3, and the movable terminal of the switch SW4 is connected to the other electrode of the capacitor C3.

The switches SW1 to SW3 are under the control of the drive waveform (FIG. 1B) generated by an oscillator OSC. The movable terminals of the switches SW1 to SW4 are connected to the lower terminals in a section on the negative side of the drive waveform, while the movable terminals of the switches SW1 to SW4 are connected to the upper terminals in a section on the positive side of the drive waveform. In a section where the movable terminals and the lower terminals of the switches SW1 to SW4 are connected, the voltages of the cells B2, B3, and B4 are supplied to the capacitors C1, C2, and C3. In a section on the negative side of the next drive waveform, in which the movable terminals of the switches SW1 to SW4 are connected to the upper terminals, the voltages of the cells B1, B2, and B3 are supplied to the capacitors C1, C2, and C3.

Accordingly, in one cycle of the drive waveform, a current flows through the capacitor C1 so that the voltages of the cells B1 and B2 become equal, a current flows through the capacitor C2 so that the voltages of the cells B2 and B3 become equal, and a current flows through the capacitor C3 so that the voltages of the cells B3 and B4 become equal. After a predetermined period, the voltages of the cell B1 to B4 become equal.

The conventional active balancing circuits using switched capacitors are used to equalize the voltages of cells in a battery module, but not to equalize the voltages of battery modules. Further, changing all the connections between switches and capacitors is needed when changing the number of cells, leading to a problem of insufficient flexibility. The present disclosure is to solve these problems as described below.

Figure 2:
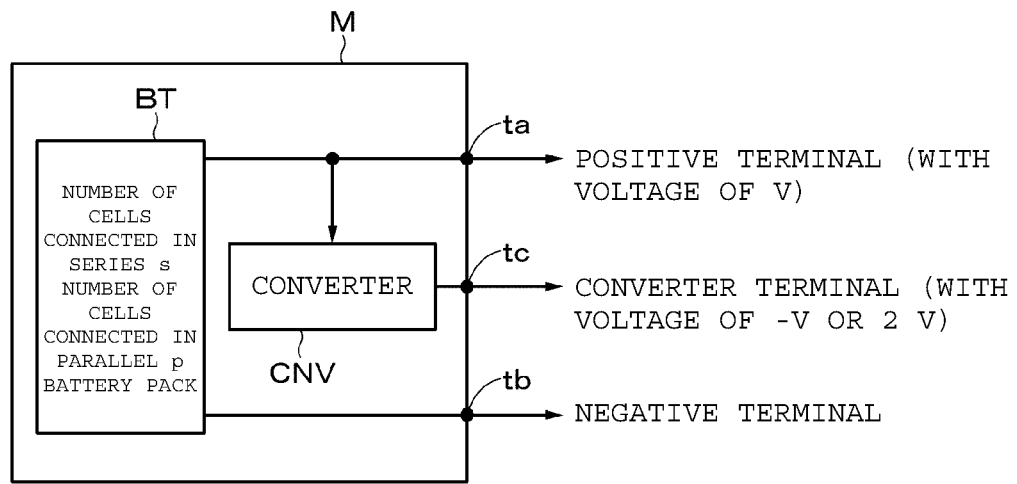
FIG. 2 is a block diagram of an embodiment of the present disclosure.
Figure 3:
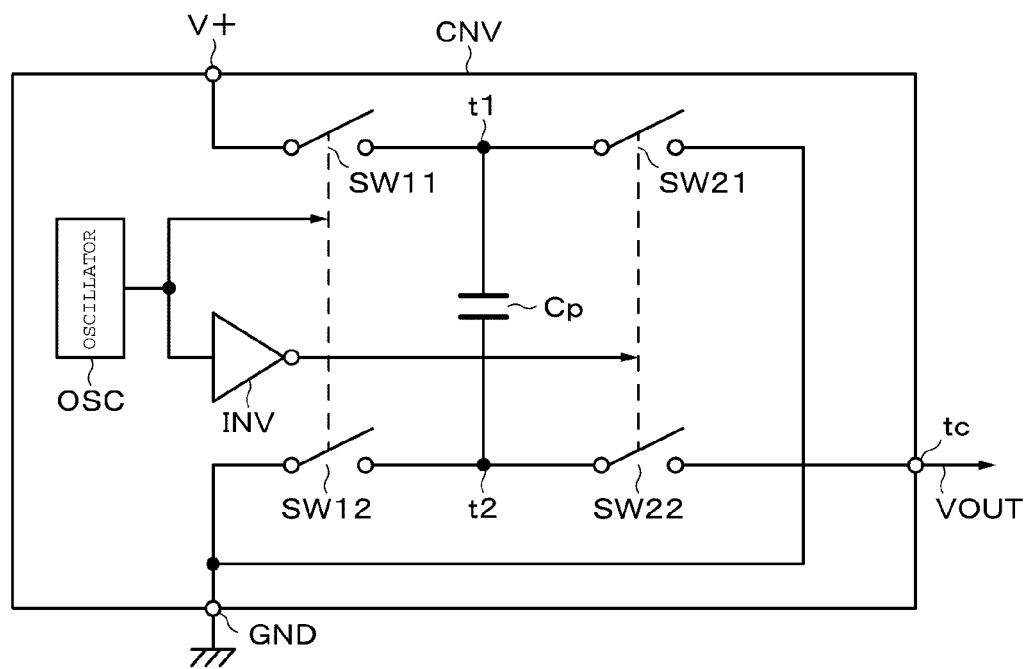
FIG. 3 is a connection diagram of an example of a converter that can be used in the present disclosure.

The first embodiment of the present disclosure is described referring to FIGS. 2 and 3. A battery module M includes a battery pack BT wherein a plurality of cells (for example, lithium ion secondary batteries) are connected in series and/or in parallel and a positive terminal ta (with a voltage V) and a negative terminal tb are provided, and a converter CNV which is connected to the positive terminal ta of the battery pack BT and outputs a voltage nV (n is −1 or 2) to a converter terminal tc. In the battery pack BT, the number of cells connected in series is s (s is an integer of 1 or more), and the number of cells connected in parallel is p (p is an integer of 1 or more) The converter CNV is a bidirectional DC/DC converter wherein a current can flow in either direction.

As one example, the battery pack BT and the converter CNV are housed in the same exterior case. Accordingly, battery modules integrally including the battery packs BT and the converters CNV are connected in series to constitute a battery unit. The present disclosure can flexibly allow a change in the number of battery modules when the voltages of a plurality of battery modules are actively balanced in the battery unit.

An example of the converter CNV (an example of outputting V) is described referring to FIG. 3. Switches SW11 and SW21 are connected in series between a terminal V+ and the ground, and switches SW12 and SW22 are connected in series between a terminal GND and the converter terminal tc (VOUT). A capacitor Cp is connected between a connection point t1 of the switches SW11 and SW21 and a connection point t2 of the switches SW12 and SW22.

A control signal which controls the switches SW11 and SW12 is generated by an oscillator OSC, and inverted by an inverter INV to control the switches SW21 and SW22. When the output of the oscillator OSC is at a high level, the interlocking switches SW11 and SW12 are turned on, and the interlocking switches SW21 and SW22 are turned off. Accordingly, a terminal t1 is connected to the terminal V+, and a terminal t2 is connected to the terminal GND. As a result, a voltage V from the terminal V+ is accumulated in the capacitor Cp.

When the output of the oscillator OSC is at a low level, the interlocking switches SW11 and SW12 are turned off, and the interlocking switches SW21 and SW22 are turned on. Accordingly, the terminal t1 is connected to ground, and the terminal t2 is connected to the terminal tc. As a result, a voltage −V obtained by inverting the voltage accumulated in the capacitor Cp is output from the terminal tc. Thereby, both the voltage V and −V outputs can be generated by the converter CNV.

Figure 4:
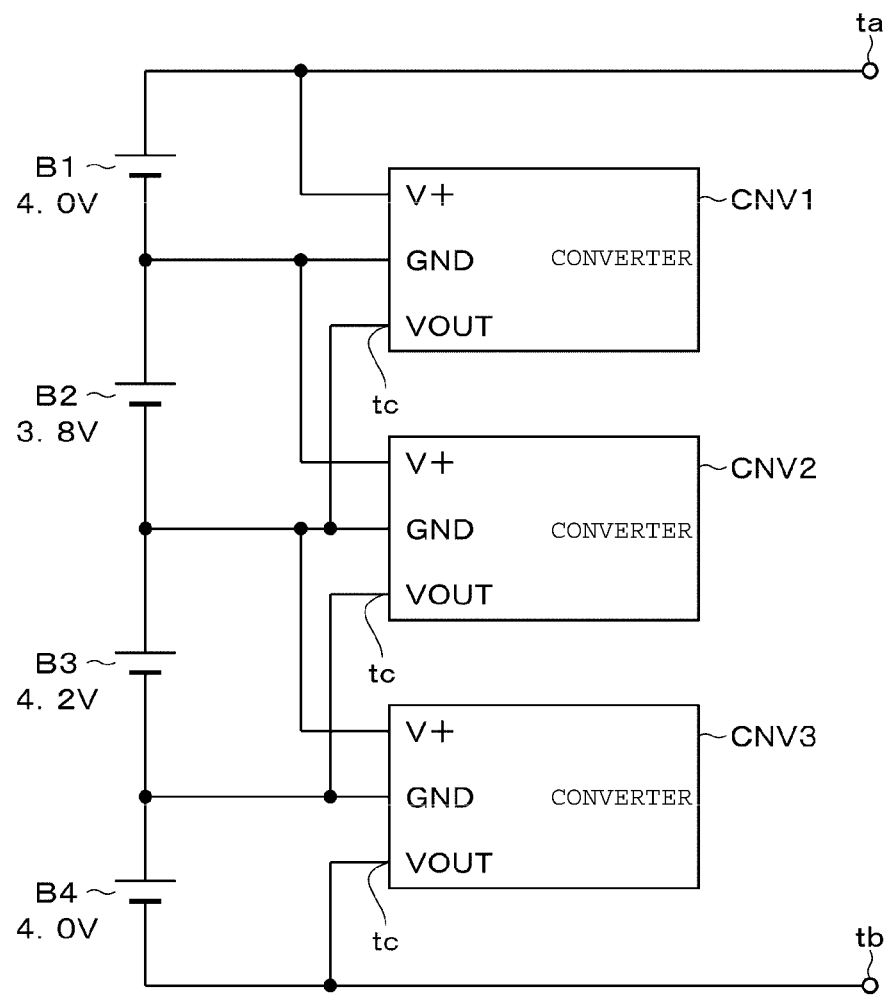
FIG. 4 is a connection diagram of a circuit configuration used in the simulation of the present disclosure.

Simulation using LTspice (registered trademark) can confirm that active balancing is possible using such a converter CNV. FIG. 4 is a circuit configuration used for simulation wherein four cells (or battery modules) B1, B2, B3, and B4 connected in series and three converters CNV1, CNV2, and CNV3 are used.

The positive terminal ta is led out from the positive side of the cell B1, and the negative terminal tb is led out from the negative side of the cell B4. The positive side of the cell B1 is connected to the terminal V+ of the converter CNV1, the negative side of the cell B1 is connected to the terminal GND of the converter CNV1, and the negative side of the cell B2 is connected to the terminal tc (VOUT) of the converter CNV1. Similarly, the cells B2 and B3 are connected to the converter CNV2, and the cells B3 and B4 are connected to the converter CNV3.

When the voltage V is applied to the terminal V+, the voltage difference between the terminal GND and the terminal tc (VOUT) of each converter becomes V. If there is a difference between the voltage of the cell and the voltage of the cell immediately below said cell, the current flows in either direction in the converter, leading to the same voltage for both cells. When the converter generates 2 V, the voltage difference between the terminal tc (VOUT) and the terminal V+ is V. If there is a difference between the voltage of the cell and the voltage of the cell immediately above said cell, the current flows in either direction in the converter, leading to the same voltage for both cells.

Figure 5:
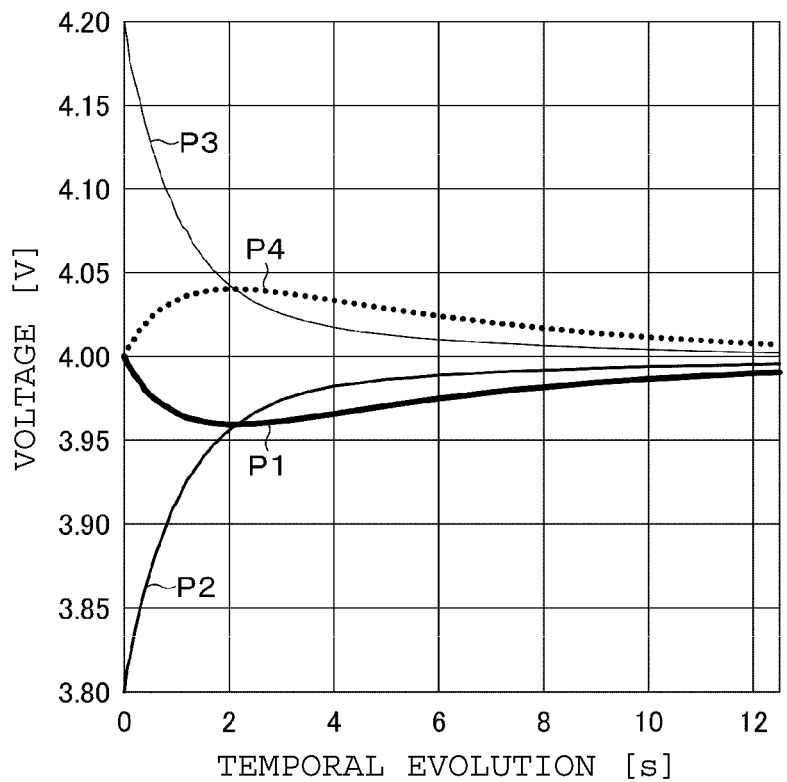
FIG. 5 is a graph illustrating a simulation result.

One example is, when the initial voltage of the cell B1 is 4.0 V and the voltages of the cells B2, B3, and B4 are respectively 4.0 V, 3.8 V, and 4.0 V, the result of simulation as illustrated in FIG. 5 shows that voltages thereof change with time. The cells B1 to B4 were described as 0.5 F capacitors (equivalent to about 0.5 mAh), the internal resistance of the capacitor simulating a cell was 50 mΩ, and the parallel capacitance was 1 mF. An inverting charge pump IC (LTC660) manufactured by Linear Technology Corporation was used as a converter capable of generating −V. In the converter, the capacitance of the capacitor Cp was set to 150 μF. Under these conditions, a simulation of temporal evolution of 12 minutes was conducted to calculate how the voltage of each cell changes.

The voltage of the cell B1 once decreased and then turned to an increase after about 2 minutes, as the curve P1 indicates. Thereafter, the voltage thereof showed a convergence behavior to the original 4.0 V. The voltage of the cell B2 monotonously increased and converged to 4.0 V, as the curve P2 indicates. The voltage of the cell B3 monotonously decreased and converged to 4.0 V, as the curve P3 indicates. The voltage of the cell B4 once increased and then turned to a decrease after about 2 minutes, as the curve P4 indicates. Thereafter, the voltage thereof showed a convergence behavior to the original 4.0 V. The voltages of the cells B1 and B4 once decreased and increased and then converged to 4.0 V, which was unrelated to the initial voltage 4.0 V. This is because only the proximate cell could be equalized in the configuration of FIG. 4.

As a result, the voltage of all cells showed a convergence behavior to 4.0 V. In this simulation, considering that the capacities of all cells are equal, the charges stored in the capacitors are proportional to the voltages, and the average of the initial voltages of all cells is 4.0 V, a convergence behavior to 4.0 V shown by the voltages of all cells means that the charges are equalized.

According to the first embodiment of the present disclosure, flexible application is available in a way that one battery module is added or reduced since the converter terminal that outputs −V or 2 V is provided. Another advantage is that preparing a balancing circuit connected to all the battery modules is not necessary in addition to the battery modules.

Figure 6:
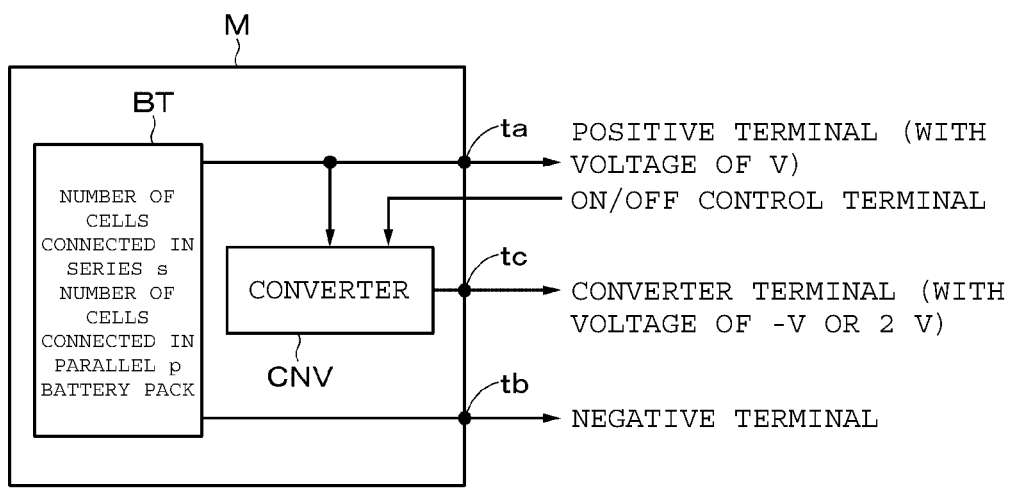
FIG. 6 is a block diagram of an embodiment of the present disclosure.

FIG. 6 is a configuration of the second embodiment of the present disclosure. The second embodiment is different from the first embodiment in that a converter CNV has an ON/OFF control terminal. ON/OFF of the converter CNV is controlled by ON/OFF of an oscillator OSC in the converter CNV. If the converter CNV is ON, a balancing operation is performed, while if the converter CNV is OFF, the balancing operation is not performed. According to the second embodiment, the power consumption can be suppressed by turning off the converter CNV.

Figure 7:
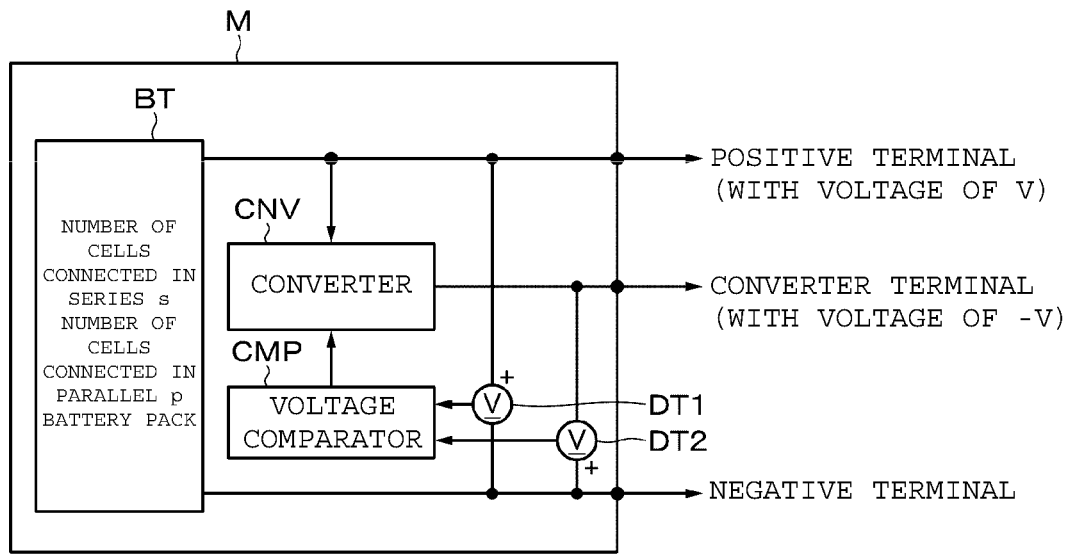
FIG. 7 is a block diagram of an embodiment of the present disclosure.

FIG. 7 is a configuration of the third embodiment of the present disclosure. In the third embodiment, a converter CNV is configured to output −V. Further, a voltage measuring device DT1 that measures a voltage between a positive terminal and a negative terminal of a battery module and a voltage measuring device DT2 that measures a voltage between a converter terminal of the converter CNV and the negative terminal of the battery module are provided. A voltage comparator CMP that compares the voltages measured by the voltage measuring devices DT1 and DT2 is provided. The output of the voltage comparator CMP is supplied to an ON/OFF control terminal of the converter CNV.

The voltage comparator CMP controls the converter CNV so as to turn on the converter CNV when a ratio ΔV of the voltages separately measured by the voltage measuring devices DT1 and DT2 is equal to or more than a threshold value, and to turn off the converter CNV when the ratio ΔV of the voltages is less than the threshold value. The threshold value can use, for example, about 2%. As compared with a configuration in which the converter CNV is always turned on, power consumption in the third embodiment can be suppressed since the converter CNV is turned on only when the balancing operation is required.

Figure 8:
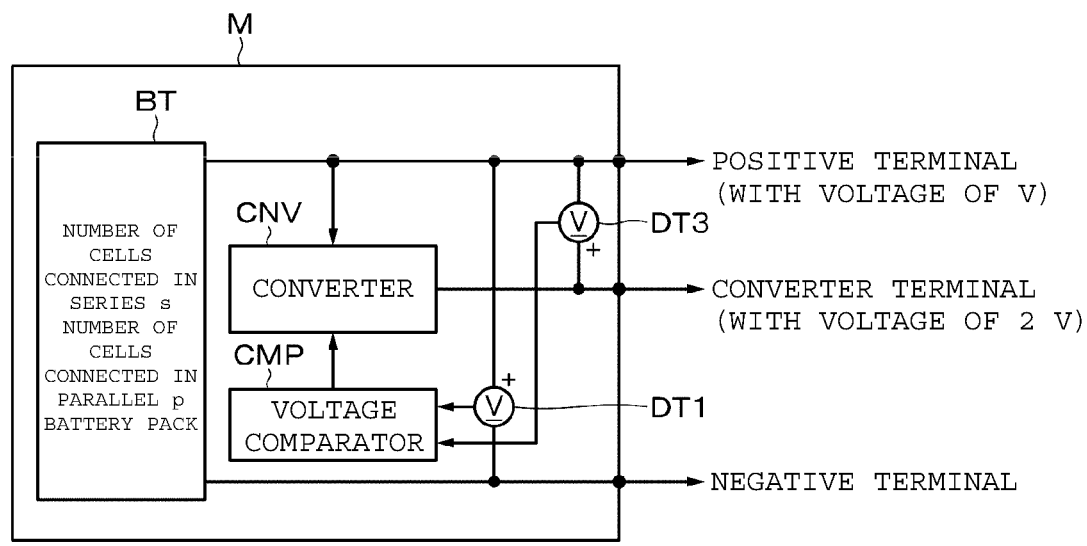
FIG. 8 is a block diagram of an embodiment of the present disclosure.

FIG. 8 is a configuration of the fourth embodiment of the present disclosure. In the fourth embodiment, a converter CNV is configured to output 2 V. Further, a voltage measuring device DT1 that measures a voltage between a positive terminal and a negative terminal of a battery module and a voltage measuring device DT3 that measures a voltage between a converter terminal of the converter CNV and the positive terminal of the battery module are provided. A voltage comparator CMP that compares the voltages measured by the voltage measuring devices DT1 and DT3 is provided. The output of the voltage comparator CMP is supplied to an ON/OFF control terminal of the converter CNV.

The voltage comparator CMP controls the converter CNV so as to turn on the converter CNV when a ratio ΔV of the voltages separately measured by the voltage measuring devices DT1 and DT3 is equal to or more than a threshold value, and to turn off the converter CNV when the ratio ΔV of the voltages is less than the threshold value. As compared with a configuration in which the converter CNV is always turned on, power consumption in the fourth embodiment, similar to that in the third embodiment, can be suppressed since the converter CNV is turned on only when the balancing operation is required.

Figure 9:
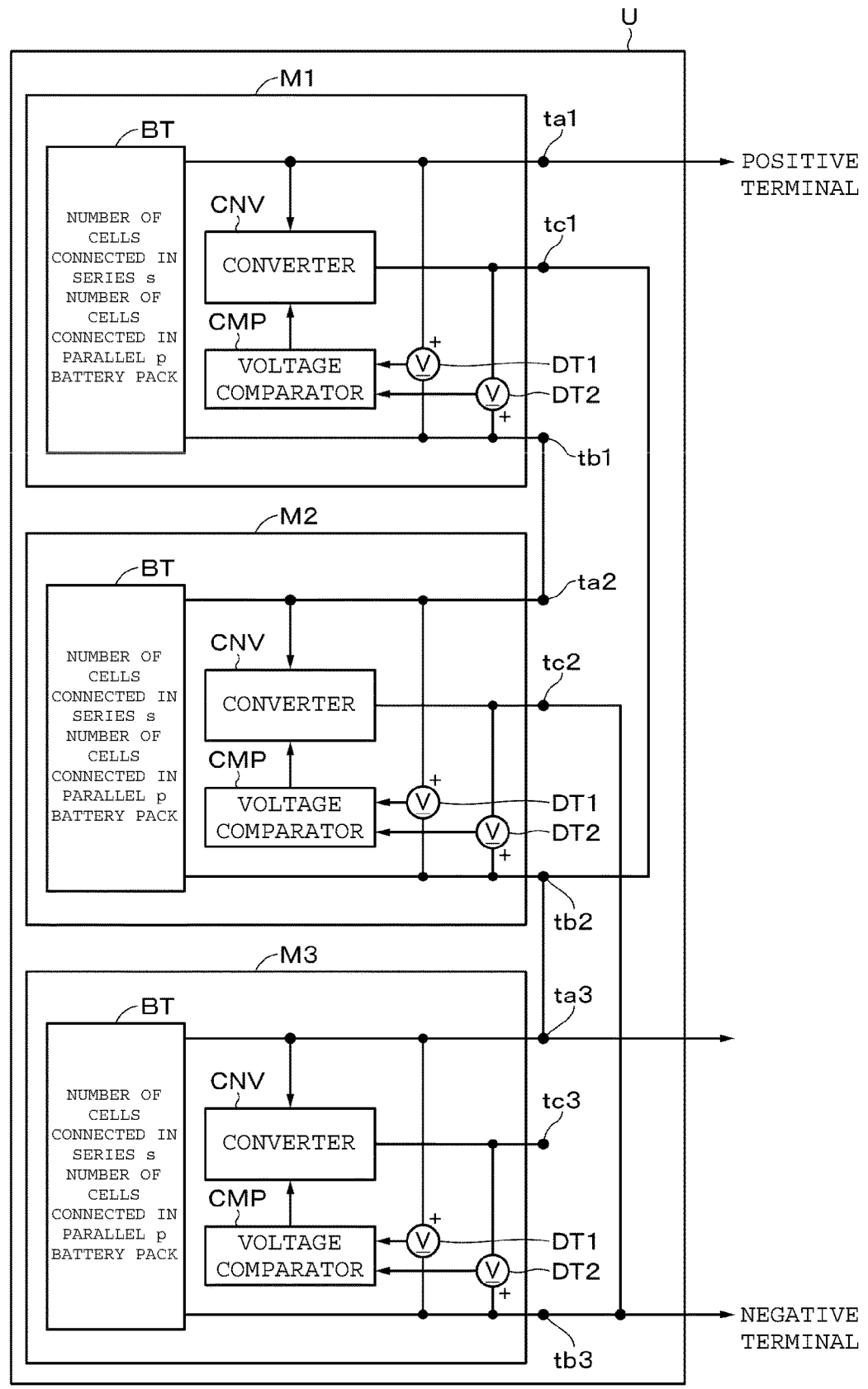
FIG. 9 is a block diagram of an embodiment of the present disclosure.

FIG. 9 is a configuration of the fifth embodiment of the present disclosure. As illustrated in FIG. 9, a battery unit U is configured by connecting in series m (m is an integer of 2 or more), for example, the three battery modules (including the converter CNV that generates −V) of the third embodiment above. Since each of battery modules M1, M2, and M3 has the same configuration as that of the battery module illustrated in FIG. 7, corresponding components are denoted as the same reference numerals. The positive terminals of the battery modules are denoted as ta1, ta2, and ta3, the negative terminals are denoted as tb1, tb2, and tb3, and the converter terminals are denoted as tc1, tc2, and tc3.

A positive terminal ta1 of the battery module M1 is led out as a positive terminal of the battery unit U, and a negative terminal tb3 of the battery module M3 is led out as a negative terminal of the battery unit U. A negative terminal tb1 and a positive terminal ta2 are connected, a negative terminal tb2 and a positive terminal ta3 are connected, and the battery modules M1 to M3 are connected in series.

Further, the converter terminal tc1 (voltage −V) of the battery module M1 is connected to the negative terminal tb2 of another battery module M2 which is connected to the negative terminal tb1 side of the battery module M1. With this connection, a current corresponding to the voltage difference between the battery modules M1 and M2 flows from the converter CNV to a battery pack BT of the battery module M1 when the converter CNV is ON.

Further, the converter terminal tc2 (voltage −V) of the battery module M2 is connected to the negative terminal tb3 of another battery module M3 which is connected to the negative terminal tb2 side of the battery module M2. With this connection, a current corresponding to the voltage difference between the battery modules M2 and M3 flows from the converter CNV to the battery pack BT of the battery module M2 when the converter CNV is ON. In the fifth embodiment, the voltages of the three battery modules M1 to M3 can be made substantially equal after time elapses.

Figure 10:
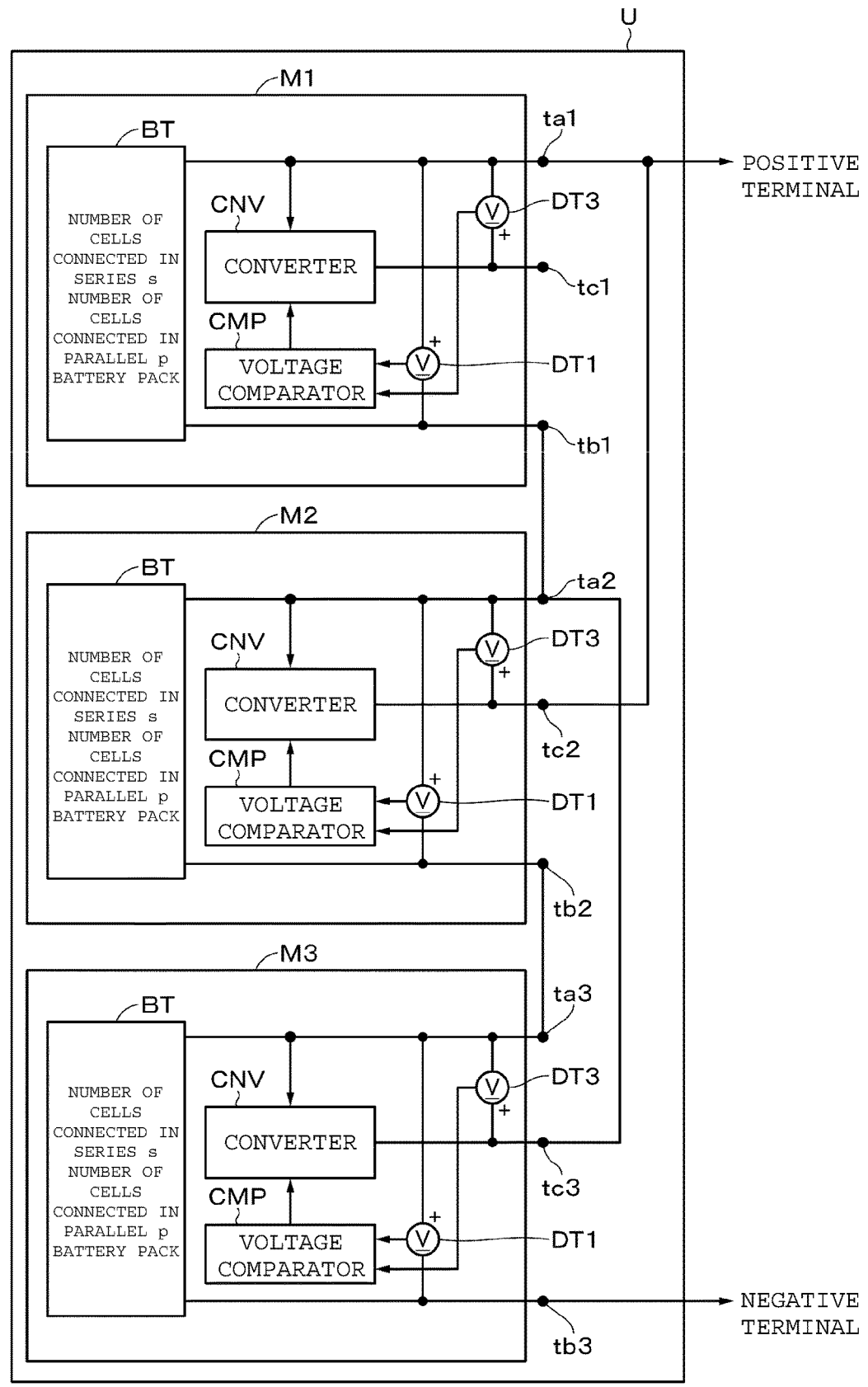
FIG. 10 is a block diagram of an embodiment of the present disclosure.

FIG. 10 is a configuration of the sixth embodiment of the present disclosure. As illustrated in FIG. 10, a battery unit U is configured by connecting in series m (m is an integer of 2 or more), for example, the three battery modules (including the converter CNV that generates 2 V) of the fourth embodiment above. Since each of battery modules M1, M2, and M3 has the same configuration as that of the battery module illustrated in FIG. 8, corresponding components are denoted as the same reference numerals. The positive terminals of the battery modules are denoted as ta1, ta2, and ta3, the negative terminals are denoted as tb1, tb2, and tb3, and the converter terminals (outputting 2 V) are denoted as tc1, tc2, and tc3.

The positive terminal to of the battery module M1 is led out as a positive terminal of the battery unit U, and the negative terminal tb3 of the battery module M3 is led out as a negative terminal of the battery unit U. The negative terminal tb1 and the positive terminal ta2 are connected, the negative terminal tb2 and the positive terminal ta3 are connected, and battery modules M1 to M3 are connected in series.

Further, the converter terminal tc2 (voltage 2 V) of the battery module M2 is connected to the positive terminal ta1 of another battery module M1 which is connected to the positive terminal ta2 side of the battery module M2. With this connection, a current corresponding to the voltage difference between the battery modules M1 and M2 flows from the converter CNV to a battery pack BT of the battery module M2 when the converter CNV is ON.

Further, the converter terminal tc3 (voltage 2 V) of the battery module M3 is connected to the positive terminal ta2 of another battery module M2 which is connected to the positive terminal ta3 side of the battery module M3. With this connection, a current corresponding to the voltage difference between the battery modules M2 and M3 flows from the converter CNV to the battery pack BT of the battery module M3 when the converter CNV is ON. In the sixth embodiment, the voltages of the three battery modules M1 to M3 can be made substantially equal after time elapses.

Figure 11:
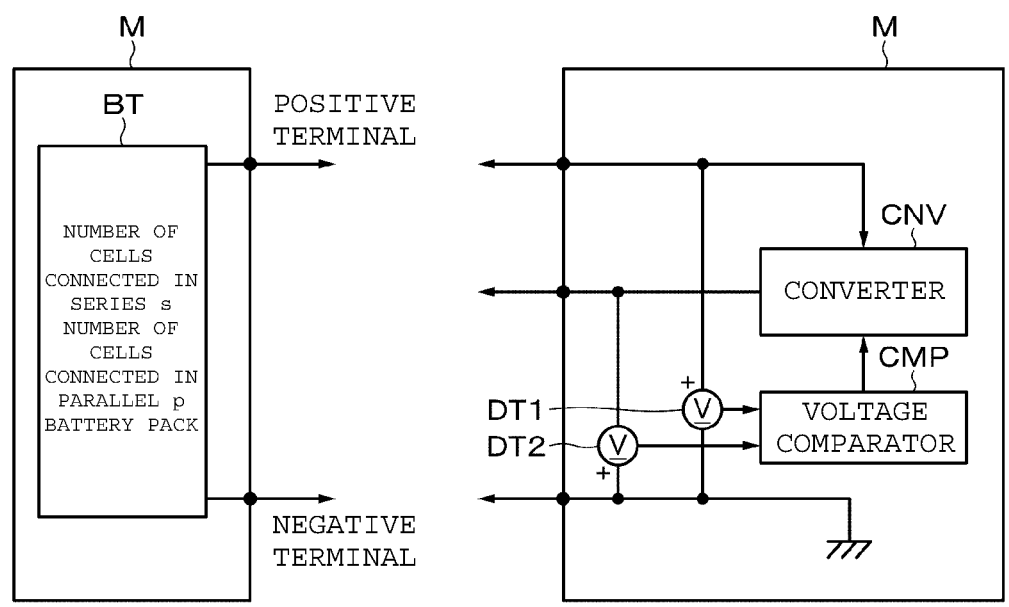
FIG. 11 is a block diagram of an embodiment of the present disclosure.

FIG. 11 is a configuration of the seventh embodiment of the present disclosure. In the embodiment above, each of the battery modules includes the converter CNV, the voltage comparator CMP, and the voltage measuring devices DT1 and DT2, but as illustrated in FIG. 11, the configuration of the converter device may be independent of the battery module. With such a configuration, the converter device can be connected to the existing battery module later.

Although the embodiments of the present disclosure have been specifically described above, the present disclosure is not limited to the embodiments above, and various modifications can be made based on the technical idea of the present disclosure. Further, one or a plurality of arbitrarily selected embodiments can be appropriately combined. Additionally, the configurations, methods, steps, shapes, materials, numerical values, and others of the embodiments above can be combined with each other without departing from the gist of the present disclosure. It is therefore intended that such changes and modifications be covered by the appended claims.

The invention claimed is:

1. A battery module comprising:
   a battery pack including cells connected in series with an amount of s and cells connected in parallel with an amount of p, wherein s is an integer of 1 or more and p is an integer of 1 or more; and
   a bidirectional DC/DC converter,
   wherein the bidirectional DC/DC converter is configured to generate a voltage nV with respect to a voltage V of the battery pack, and wherein n is −1 or 2, and
   wherein the bidirectional DC/DC converter is configured to be switched between ON and OFF;
   a first voltage measurement unit configured to measure a voltage between a negative terminal and a positive terminal;
   a second voltage measurement unit configured to measure a voltage between a converter terminal and the negative terminal; and
   a voltage comparator configured to compare a voltage measured by the first voltage measurement unit with a voltage measured by the second voltage measurement unit,
   wherein when a ratio of the voltages measured by the first and second voltage measuring devices is equal to or more than a threshold value, the operation of the bidirectional DC/DC converter is turned on to generate a voltage −1V, and when the ratio of the voltages measured by the first and second voltage measuring devices is less than the threshold value, the operation of the bidirectional DC/DC converter is turned off to stop the generation of the voltage −1V.

2. A battery module comprising:
   a battery pack including cells connected in series with an amount of s and cells connected in parallel with an amount of p, wherein s is an integer of 1 or more and p is an integer of 1 or more;
   a bidirectional DC/DC converter,
   wherein the bidirectional DC/DC converter is configured to generate a voltage nV with respect to a voltage V of the battery pack, and wherein n is −1 or 2, and
   wherein the bidirectional DC/DC converter is configured to be switched between ON and OFF;
   a first voltage measurement unit configured to measure a voltage between a negative terminal and a positive terminal;
   a third voltage measurement unit configured to measure a voltage between a converter terminal and the positive terminal; and
   a voltage comparator configured to compare a voltage measured by the first voltage measurement unit with a voltage measured by the third voltage measurement unit,
   wherein when a ratio of the voltages detected by the first and third voltage measuring devices is equal to or more than a threshold value, the operation of the bidirectional DC/DC converter is turned on to generate a voltage 2 V, and when the ratio of the voltages detected by the first and third voltage measuring devices is less than the threshold value, the operation of the bidirectional DC/DC converter is turned off to stop the generation of the voltage 2 V.

3. A battery unit comprising a plurality of battery modules wherein the battery modules each including:
- a battery pack including cells connected in series with an amount of s and cells connected in parallel with an amount of p, wherein s is an integer of 1 or more and p is an integer of 1 or more, and
- a bidirectional DC/DC converter,
- wherein the bidirectional DC/DC converter is configured to generate a voltage nV with respect to a voltage V of the battery pack, and wherein n is −1 or 2,
- wherein the battery modules each including a converter configured to generate a voltage −1V are connected in series, and
- wherein the voltage −1V generated by a battery module is supplied to a negative terminal of another battery module which is connected to a negative terminal side of the battery module.

4. The battery unit according to claim 3, wherein the converter which is respectively provided in the battery modules is configured to be switched between ON and OFF.

5. A battery comprising a plurality of battery modules wherein the battery modules each including:
- a battery pack including cells connected in series with an amount of s and cells connected in parallel with an amount of p, wherein s is an integer of 1 or more and p is an integer of 1 or more, and
- a bidirectional DC/DC converter,
- wherein the bidirectional DC/DC converter is configured to generate a voltage nV with respect to a voltage V of the battery pack, and wherein n is −1 or 2,
- wherein the battery modules each including a converter configured to generate a voltage 2 V are connected in series, and
- wherein the voltage 2 V generated by a battery module is supplied to a positive terminal of another battery module which is connected to a positive terminal side of the battery module.

6. The battery unit according to claim 5, wherein the converter which is respectively provided in the battery modules is configured to be switched between ON and OFF.

* * * * *